United States Patent
Shimizu et al.

(10) Patent No.: US 6,921,977 B2
(45) Date of Patent: Jul. 26, 2005

(54) SEMICONDUCTOR PACKAGE, METHOD OF PRODUCTION OF SAME, AND SEMICONDUCTOR DEVICE

(75) Inventors: Noriyoshi Shimizu, Nagano (JP); Akio Rokugawa, Nagano (JP); Takahiro Iijima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/647,386

(22) Filed: Aug. 26, 2003

(65) Prior Publication Data

US 2004/0041270 A1 Mar. 4, 2004

(30) Foreign Application Priority Data

Aug. 27, 2002 (JP) ........................................ 2002-247487
Mar. 5, 2003 (JP) ........................................ 2003-058792

(51) Int. Cl.[7] .......................... H01L 23/48; H01L 23/52; H01L 29/40
(52) U.S. Cl. ........................ 257/758; 257/778; 257/774; 257/701; 257/703
(58) Field of Search .................................. 257/703, 701, 257/758, 778, 774

(56) References Cited

U.S. PATENT DOCUMENTS 5,796,587 A * 8/1998 Lauffer et al. ............... 361/763
6,392,898 B1 * 5/2002 Asai et al. ................... 361/794
6,480,370 B1 * 11/2002 Koning et al. ............ 361/321.2

* cited by examiner

*Primary Examiner*—Nitin Parekh
(74) *Attorney, Agent, or Firm*—Staas & Halsey LLP

(57) ABSTRACT

A semiconductor package, provided with a multilayer interconnect structure, for mounting a semiconductor chip on its top surface, wherein a topmost stacked structure of the multilayer interconnect structure includes a capacitor structure, the capacitor structure having a dielectric layer comprised of a mixed electrodeposited layer of high dielectric constant inorganic filler and insulating resin and including chip connection pads for directly connecting top electrodes and bottom electrodes with electrodes of the semiconductor chip, whereby greater freedom in design of interconnect patterns can be secured, the degree of proximity of the capacitor and semiconductor chip can be greatly improved, and the package can be made smaller and lighter in weight, a method of production of the same, and a semiconductor device using this semiconductor package.

10 Claims, 16 Drawing Sheets

SEMICONDUCTOR PACKAGE, METHOD OF PRODUCTION OF SAME, AND SEMICONDUCTOR DEVICE

BACKGROUND OF THE INVENTION

1. Field of the Invention

The present invention relates to a package for mounting a semiconductor chip, that is, a semiconductor package, a method of production of the same, and a semiconductor device comprised of that semiconductor package and a semiconductor chip mounted in it.

2. Description of the Related Art

Semiconductor devices are being made increasingly denser in many applications. In accordance with this, when providing interconnect patterns in close proximity, it is important to prevent crosstalk noise between interconnects and fluctuations in potential of power lines etc. In particular, in the case of a semiconductor package mounting a high frequency semiconductor chip required for high speed switching operations, crosstalk noise occurs more easily along with a rise in the frequency. Further, high speed on/off operations of switching elements also cause switching noise. Due to this, the potential of the power lines etc. fluctuates more easily.

In the past, as means for eliminating such problems, a separate chip capacitor or other capacitor was mounted in a semiconductor package as a bypass capacitor for eliminating unnecessary coupling between circuits by signal lines or power lines (decoupling).

The method of the related art, however, suffered from the following problems.

First, the degree of freedom of design of the interconnect patterns falls along with mounting of a separate chip capacitor etc.

Further, if the interconnect distance connecting a chip capacitor and semiconductor chip is long, the inductance becomes larger and the decoupling effect of the chip capacitor can no longer be obtained. Therefore, the chip capacitor etc. has to be mounted in as close proximity to the semiconductor chip as possible. The size of the chip capacitor etc., however, restricts the mounting position, so there were also limits to the proximity of arrangement with respect to the semiconductor chip.

Further, if mounting a chip capacitor or other capacitor in a semiconductor package, the package unavoidably becomes larger in size and heavier in weight. This runs counter to the current trend of the reduction of size and weight. In this regard as well, there were limits to measures through reduction of size of the chip capacitor etc.

SUMMARY OF THE INVENTION

An object of the present invention is to solve the above problems in the related art and provide a semiconductor package securing a degree of freedom of design of the interconnect patterns, greatly improving the degree of proximity between the capacitor and semiconductor chip, and enabling a reduction in size and weight of the package, a method of production of the same, and a semiconductor device using the semiconductor package.

To attain the above object, according to a first aspect of the invention, there is provided a semiconductor package, provided with a multilayer interconnect structure, for mounting a semiconductor chip on its top surface, wherein a topmost stacked structure of the multilayer interconnect structure includes a capacitor structure, the capacitor structure having a dielectric layer comprised of a mixed electrodeposited layer of high dielectric constant inorganic filler and insulating resin and including chip connection pads for directly connecting top electrodes and bottom electrodes with electrodes of the semiconductor chip.

According to a second aspect of the present invention, there is provided a semiconductor package, comprised of an insulating substrate on top and bottom surfaces of which multilayer interconnect structures are provided, for mounting a semiconductor chip on the top surface of the top surface multilayer interconnect structure, wherein the top surface multilayer structure includes a capacitor structure, the capacitor structure having a dielectric layer comprised of a mixed electrodeposited layer of high dielectric constant inorganic filler and insulating resin and a topmost layer of the top surface multilayer interconnect structure includes chip connection pads for connecting top electrodes and bottom electrodes with electrodes of the semiconductor chip inside a region superposed with the capacitor structure in a plan view. In this case, the top surface multilayer interconnect structure may include a plurality of stacked capacitor structures.

As the high dielectric constant inorganic filler, it is most advantageous to use a powder of ceramic having a perovskite structure.

As the insulating resin, it is most advantageous to use a polyimide resin.

According to a third aspect of the present invention, there is provided a semiconductor device comprised of one of the above semiconductor packages and a semiconductor chip directly connected at its electrodes to the chip connection pads.

According to a fourth aspect of the present invention, there is provided a method of production of a semiconductor package, provided with a multilayer interconnect structure, for mounting a semiconductor chip on its top surface, comprising a step of forming a capacitor structure in a topmost stacked structure of the multilayer interconnect structure, the capacitor structure formation step comprising processing for forming at a bottommost layer of the topmost stacked structure a conductor layer for bottom electrodes of the capacitor structure, processing for forming on the bottom electrodes by electrodeposition using an electrolyte comprised of high dielectric constant inorganic filler and insulating resin dispersed in a colloidal state a mixed electrodeposited layer of the inorganic filler and the insulating resin as a dielectric layer of the capacitor structure, processing for forming on the dielectric layer a conductor layer for top electrodes of the capacitor structure, and processing for forming inside the capacitor structure chip connection pads for directly connecting the top electrodes and the bottom electrodes with the electrodes of the semiconductor chip.

According to a fifth aspect of the present invention, there is provided a method of production of a semiconductor package, comprised of an insulating substrate on top and bottom surfaces of which multilayer interconnect structures are provided, for mounting a semiconductor chip on the top surface of the top surface multilayer interconnect structure, comprising a step of forming a capacitor structure in the top surface multilayer interconnect structure, the capacitor structure formation step comprising processing for forming a conductor layer for bottom electrodes of the capacitor structure, processing for forming on the bottom electrode by electrodeposition using an electrolyte comprised of high dielectric constant inorganic filler and insulating resin dispersed in a colloidal state a mixed electrodeposited layer of the inorganic filler and the insulating resin as a dielectric layer of the capacitor structure, processing for forming on the dielectric layer a conductor layer for top electrodes of the capacitor structure, and processing for forming chip connection pads for connecting the top electrode and the bottom electrode with electrodes of the semiconductor chip in a region of the topmost layer of the top surface multilayer interconnect structure superposed with the capacitor layer in a plan view. In this case, the method may further include a step of forming the capacitor structure by stacking a plurality of layers.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

First Embodiment

Figure 1:
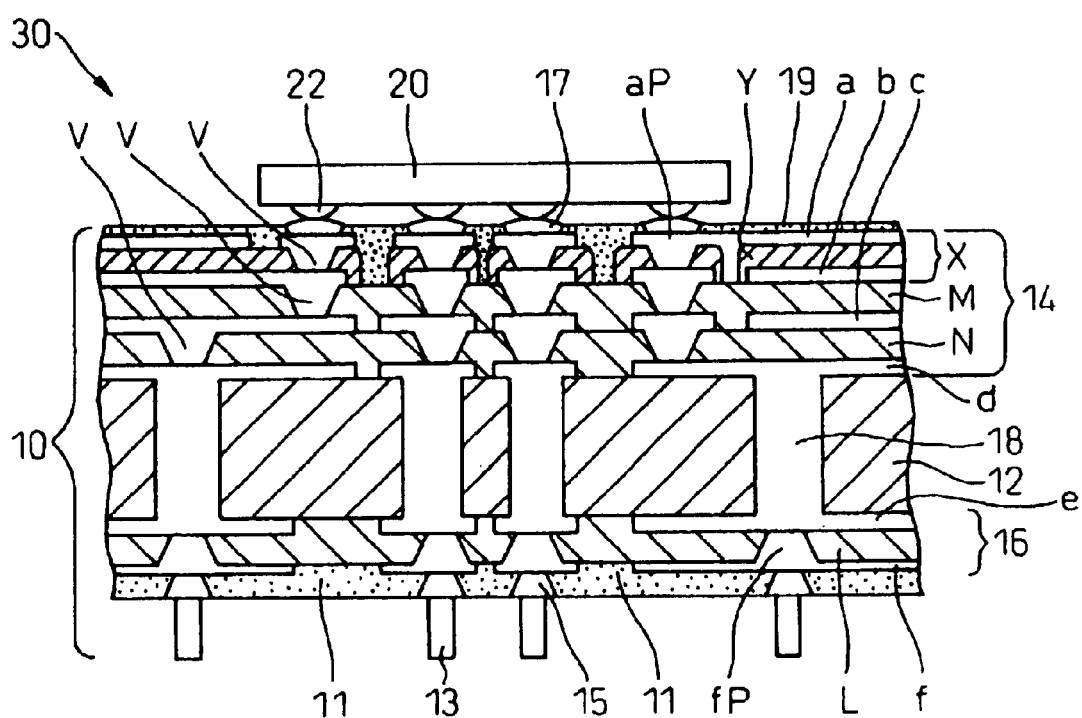
FIG. 1 is a sectional view of a semiconductor device according to the present invention comprised of a semiconductor package according to a first embodiment of a first aspect of the invention and a semiconductor chip mounted in the same.

FIG. 1 is a partial sectional view of a semiconductor device 30 according to the present invention comprised of a semiconductor package 10 according to a first aspect of the present invention and a semiconductor chip 20 mounted in the same.

The semiconductor package 10 according to the first aspect of the invention is provided with a multilayer interconnect structure 14 stacked on the top surface of an insulating substrate 12, a bottom surface interconnect structure 16 formed on the bottom surface of the insulating substrate 12, and through holes 18 electrically connecting a bottommost layer "d" of the multilayer interconnect structure 14 and topmost layer "e" of the bottom surface interconnect structure 16 through the insulating substrate 12.

The bottom surface interconnect structure 16 is a structure of two interconnect layers "e" and "f" stacked via an insulating layer L. Predetermined locations of the bottommost interconnect layer "f" are formed as outside connection pads fP. Solder 15 is used to bond outside connection terminals (pins) 13 with them. The illustrated four pins 13 include for example a ground terminal (GR) at the left end, two signal terminals (S) at the center, and a power terminal (P) at the right end. The bottom surface of the bottom surface interconnect structure 16 is covered by a solder resist 11 except at the positions of the solder 15.

The multilayer interconnect structure 14 is comprised of four interconnect layers "a", "b", "c", and "d" stacked via the following dielectric layer Y or insulating layers M and N. The interconnect layers "a" to "b" are electrically connected by vias V passing through the dielectric layer Y or insulating layers M and N.

The characterizing feature of the first aspect of the invention is that a multilayer interconnect structure 14 is formed as a capacitor structure X at its topmost part. The capacitor structure X is comprised of a top electrode layer comprised of an interconnect layer "a", a dielectric layer Y, and a bottom electrode layer comprised of an interconnect layer "b". The dielectric layer Y is comprised of a mixed electrodeposited layer of high dielectric constant inorganic filler and insulating resin. Predetermined locations of the top electrode layer "a" are formed as the chip connection pads aP and are directly connected to the electrode pads 22 of the semiconductor chip 20 by solder 17. That is, the solder 17 is provided by coating solder paste by screen printing or mounting solder balls. The solder 17 is made to melt to connect the electrode bumps 22 of the semiconductor chip 20. The electrode bumps 22 are directly formed by solder on the electrodes of the capacitor chip 20 and are substantially integral with the electrodes. Further, while not shown in FIG. 1 due to the restrictions in illustration, as explained below, other locations of the interconnect layer forming the top electrode layer "a" are formed with regions insulated and sectioned off from the surroundings as chip connection pads bP for the bottom electrodes "b". These are directly connected with other electrode bumps 22 of the semiconductor chip 20 without going through another interconnect route. The top surfaces of the top electrodes "a" are covered by the solder resist 19 except for the positions of the solder 17.

Figure 2:
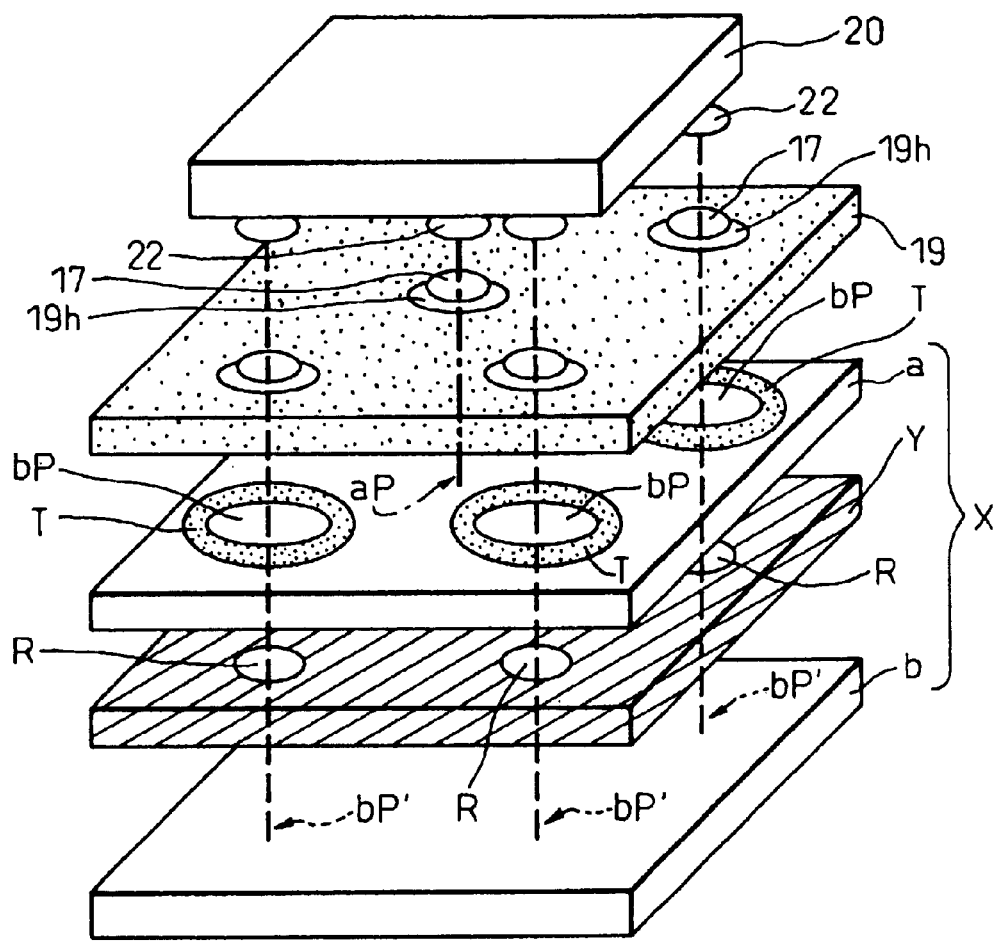
FIG. 2 is a disassembled view of a layer configuration of an interior capacitor in a semiconductor package of FIG. 1.

Referring to the schematic disassembled view of FIG. 2, one form of the connection relationship between the capacitor X and semiconductor chip 20 in the semiconductor device 30 will be explained. FIG. 2 shows, from the top, a semiconductor chip 20, solder resist layer 19, top electrode layer "a", dielectric layer Y, and bottom electrode layer "b". In this example, the top electrode layer "a" becomes the power layer, while the bottom electrode layer "b" becomes the ground layer. However, it is not necessary to limit the invention to this. It is also possible to make the top electrode layer "a" the ground layer and make the bottom electrode layer "b" the power layer. The semiconductor chip 20 is actually provided with a large number of electrode bumps 22, but for convenience in illustration, only four electrode bumps are shown. Among these, the second (center of semiconductor chip 20) electrode bump 22 from the left in the figure, as shown by the dot-chain line, is directly connected to a chip connection pad aP of a top electrode "a" of the capacitor X by a solder bump 17 in the opening 19h of the solder resist layer 19. The other electrode bumps 22 of the semiconductor chip 20, as shown by the broken lines, are directly connected to the chip connection pads bP insulated and sectioned off from the surrounding top electrode layer "a" by the insulating rings T in the top electrode layer "a". These insulated and sectioned off chip connection pads bP are connected to the connection locations bP' of the bottom electrode layer "b" through the conductor layer R provided in island shapes in the dielectric layer Y.

That is, the electrode bumps 22 of the semiconductor chip 20 mounted in the package 10 and the chip connection pads aP and bP of the capacitor X formed directly below them are directly connected without going through the outside interconnect routes of the two.

In this way, by the semiconductor package of the first aspect of the invention and the semiconductor device of the present invention using the same being provided with a structure where the capacitor X built into the semiconductor package 10 and the semiconductor chip 20 mounted in the package 10 are directly connected, the connection distance between the semiconductor chip 20 and capacitor X is minimized, Due to this, an increase in inductance due to the interconnects between the semiconductor chip 20 and capacitor X does not substantially occur and the decoupling effect inherent to the capacitor X can be sufficiently obtained.

Further, the dielectric layer Y of the capacitor X can be formed as an extremely thin layer of less than 10 $\mu$m by a mixed electrodeposited layer of high dielectric constant inorganic filler and insulating resin, so the capacitor X as a whole can be formed inside the package 10 as an extremely thin structure. Therefore, there is no substantive effect on the degree of freedom of design of the interconnect patterns and simultaneously a reduction of the size and weight of the package is not inhibited.

Next, the steps for production of a semiconductor package 10 and semiconductor device 30 according to an embodiment of the first aspect of the invention will be explained with reference to FIGS. 3 to 11. The figures are sectional views of the structures obtained by the processing of the different steps.

Figure 3:
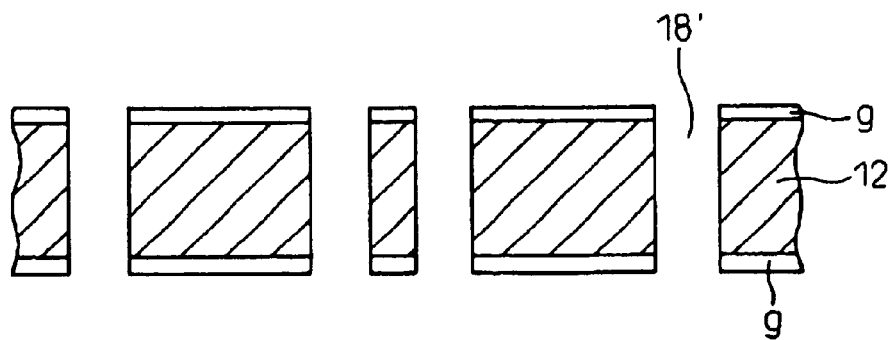
FIG. 3 is a sectional view of step 1 for producing a semiconductor package and semiconductor device according to a first embodiment of the first aspect of the invention.

Step 1. Preparation of Substrate and Formation of Through Holes (FIG. 3)

A two-surface copper-clad laminate comprised of an insulating core 12 clad on its two surfaces with copper foil "g" is formed with through holes 18' by drilling or laser processing. As the laminate used, for example an FR-4 equivalent or other glass fiber cloth impregnated with an insulating resin (epoxy resin, polyimide resin, BT resin, PPE resin, etc.) is used.

Step 2. Formation of Interconnect Layers and Filling of Through Holes (FIG. 4)

Copper is electrolessly plated or sputtered to form power feed thin conductor layers on the entire surfaces of the inside walls of the through holes 18' and copper foils "g", then copper is electroplated to fill the through holes 18' with a conductor and form conductor layers on the copper foils "g" of the two surfaces, then the copper foils and conductor layers of the two surfaces are patterned together. Due to this, the illustrated structure is obtained where the top surface and bottom surface of the insulating substrate 12 are formed with interconnect layers "d" and "e" and the interconnect layers "d" and "e" of the top and bottom surfaces are electrically connected by the through holes 18 filled with the conductor.

Step 3. Formation of Insulating Layers (FIG. 5)

Figure 4:
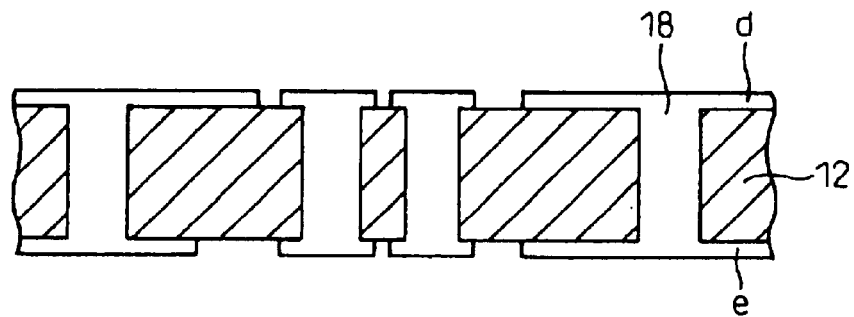
FIG. 4 is a sectional view of step 2 for producing a semiconductor package and semiconductor device according to a first embodiment of the first aspect of the invention.

The top and bottom surfaces of the structure of FIG. 4 are formed with insulating layers N and L for insulating between interconnect layers by either coating polyimide resin, epoxy resin, or another resin or stacking and adhering sheets of such resins, then via holes V' for electrically connecting the interconnect layers are formed in the insulating layers. The via holes V' are formed by laser processing (UV-YAG laser, $CO_2$ laser, excimer laser, etc.)

Figure 6:
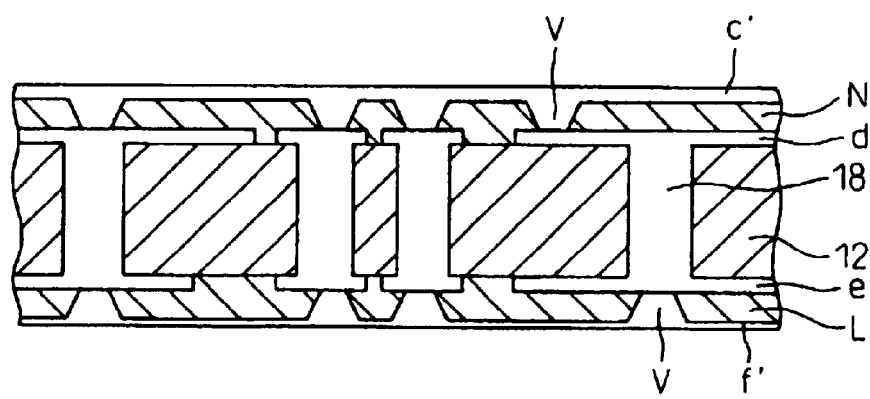
FIG. 6 is a sectional view of step 4 for producing a semiconductor package and semiconductor device according to a first embodiment of the first aspect of the invention.

Step 4. Formation of Conductor Layers and Filling of Through Holes (FIG. 6)

Figure 5:
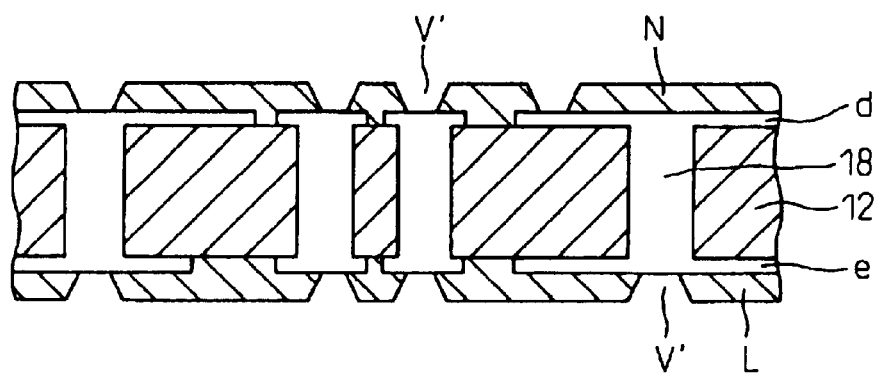
FIG. 5 is a sectional view of step 3 for producing a semiconductor package and semiconductor device according to a first embodiment of the first aspect of the invention.

The top and bottom surfaces of the structure of FIG. 5 are formed with power feed thin conductor layers by electroless plating, sputtering, etc. of copper, then copper is electroplated to fill the via holes V' with a conductor and form the top surface conductor layer c' and bottom surface conductor layer f'. Due to this, the illustrated structure is obtained where the conductor layers c'/f' of the top and bottom surfaces are electrically connected by the vias V filled with the conductor.

Figure 7:
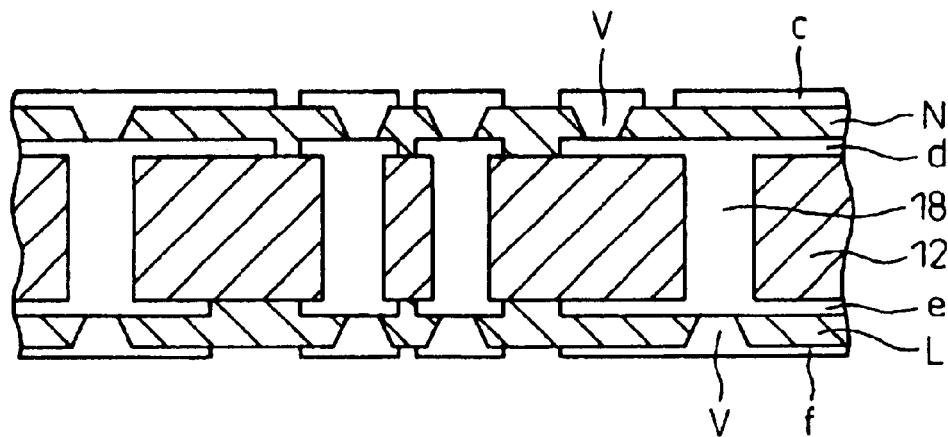
FIG. 7 is a sectional view of step 5 for producing a semiconductor package and semiconductor device according to a first embodiment of the first aspect of the invention.

Step 5. Formation of Bottom Electrodes (FIG. 7)

The conductor layers c' and f' of the top and bottom surfaces are patterned by etching. Due to this, the second top surface interconnect layer "c" and second bottom surface interconnect layer "f" are formed. These interconnect layers "c" and "f" are electrically connected at predetermined locations with the first interconnect layers "d" and "e" by these vias V.

Next, step 3 to step 5 are repeated in accordance with the required number of interconnect layers.

Figure 8:
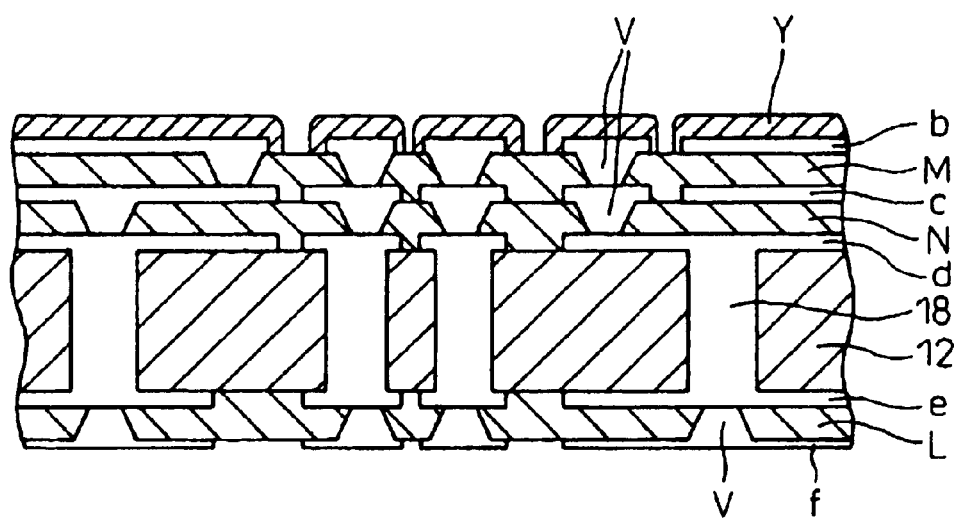
FIG. 8 is a sectional view of step 6 for producing a semiconductor package and semiconductor device according to a first embodiment of the first aspect of the invention.

Step 6. Formation of Dielectric Layer (FIG. 8)

Steps 3 to 5 are repeated exactly one more time to form the insulating layer M and interconnect layer "b" on the interconnect layer "c". Parts of the interconnect layer "b" become the bottom electrodes of the finally formed capacitor. Next, the surface is washed by alkali or acid and a dielectric layer Y is formed on the interconnect layer "b" by electrodeposition. This electrodeposition is performed as follows.

An electrolyte is prepared by mixing high dielectric constant inorganic filler powder in a polyimide resin serving as an insulating resin and dispersing the mixture in a colloidal state in isopropyl alcohol or another solvent. The substrate formed with the interconnect layer "b" is covered by a mask (not shown) at other than the top surface and is immersed in the above electrolyte, then using the substrate as a cathode side, an electric field is applied with the facing anode to cause electrophoresis of the colloid and deposit a mixed electrodeposited layer of the inorganic filler and polyimide resin on the top surface of the substrate. This is used as the dielectric layer Y. The electrodeposition for depositing the mixed electrodeposited layer in this way can be performed by connecting the interconnect layer "b" to the cathode.

The mechanism by which the mixed electrodeposited layer is formed may be considered to be as follows. That is, the colloid particles of the inorganic filler are electrically neutral and will not take on polarity, but the colloid particles of the polyimide resin take on a positive polarity and act as cations. The type of the colloid particles present in the electrolyte is considered to be particles of a form comprised of colloid particles of polyimide resin on which colloid particles of inorganic filler are deposited and agglomerate. Therefore, the colloid particles of the polyimide resin are driven by the applied electric field for electrophoresis. Along with this, the colloid particles of the inorganic filler move together with them, they reach the substrate on the cathode side, and they deposit as a mixed layer of the two.

The thickness of the dielectric layer Y formed by electrodeposition in this way can be freely set by the value of the applied current and applied time. For example, the layer can be formed extremely thin such as below 10 $\mu$m.

As the high dielectric constant inorganic filler, ceramic powder of a perovskite structure is suitable. For example, barium titanate ($BaTiO_3$), lead titanate zirconate ($Pb(Zr_XTi_{1-X})O_3$), strontium titanate ($SrTiO_3$), etc. may be used.

A polyimide resin has a dielectric property even alone, but by blending in such high dielectric constant inorganic filler, the dielectric constant of the dielectric layer comprised of the mixed electrodeposited layer of the two becomes remarkably high and a large capacitor capacitance can be realized by a thin dielectric layer.

Step 7. Formation of Via Holes of Dielectric Layer (FIG. 9)

The dielectric layer Y is formed with via holes V' by laser processing. The via holes V' include via holes for forming conductor islands R shown in FIG. 2. The laser processing is performed by a UV-YAG laser, $CO_2$ laser, excimer laser, etc. In some cases, the via holes V' may also be formed by mechanical drilling.

Figure 10:
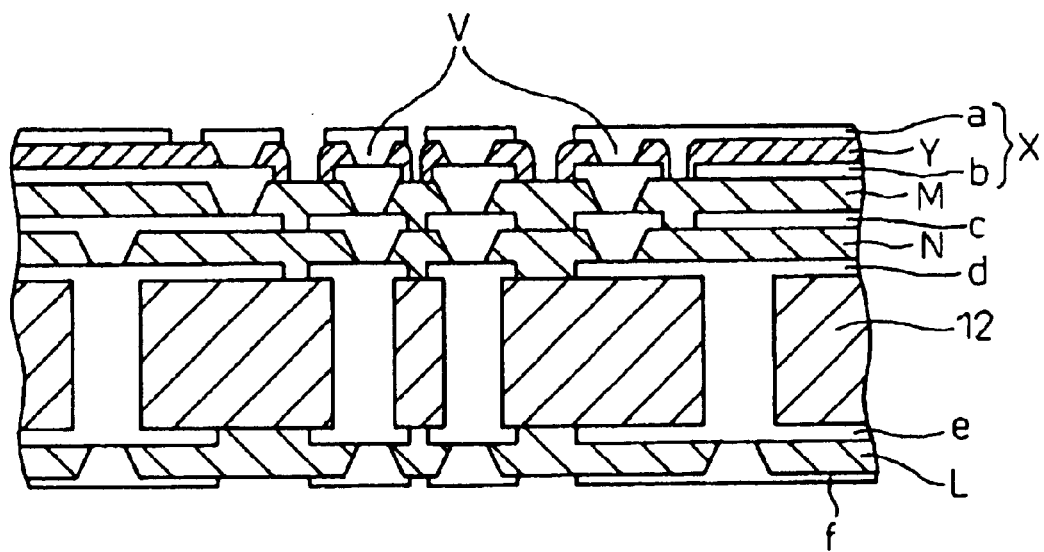
FIG. 10 is a sectional view of step 8 for producing a semiconductor package and semiconductor device according to a first embodiment of the first aspect of the invention.

Step 8. Formation of Top Electrodes (FIG. 10)

Figure 9:
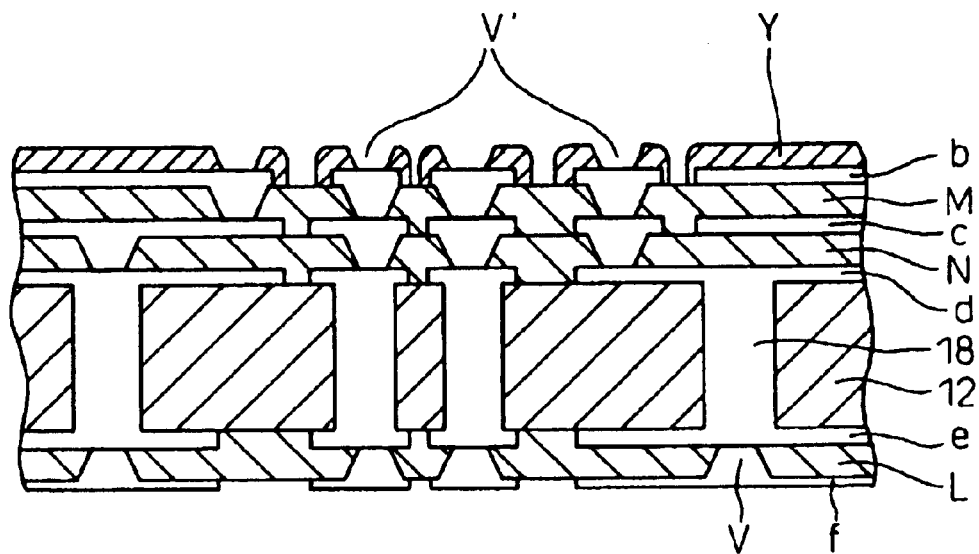
FIG. 9 is a sectional view of step 7 for producing a semiconductor package and semiconductor device according to a first embodiment of the first aspect of the invention.

The top surface of the structure of FIG. 9 is formed with a power feed thin conductor layer by electroless plating, sputtering, etc. of copper, then copper is electroplated to fill the via holes V' (FIG. 9) with a conductor and form a top surface conductor layer. This is patterned by etching so as to form the topmost top interconnect layer "a". Parts of the interconnect layer "a" become the top electrodes of the capacitor structure X. Predetermined locations of the interconnect layer "a" are electrically connected with the lower interconnect layer by the vias V filled with the conductor.

Further, predetermined locations of the top surface interconnect layer "a" are also formed with chip connection pads bP insulated and sectioned off from the surroundings by insulating rings T as shown in FIG. 2. This is done by removing the interconnect layer "a" by etching to the shapes of the insulating rings T at the time of patterning, then filling a solder resist layer 19 in the etched away parts. The portions of the interconnect layer "a" surrounded by the insulating rings T become the chip connection pads bP. By filling the via holes before etching, the bottoms of the chip connection pads bP are formed as parts of the conductor layer R (vias) passing through the dielectric layer Y. The bottom ends are connected to predetermined locations bP' of the bottom electrode layer "b".

In this way, a capacitor structure X comprised of top electrodes "a", a dielectric layer Y, and bottom electrodes "b" is completed.

Figure 11:
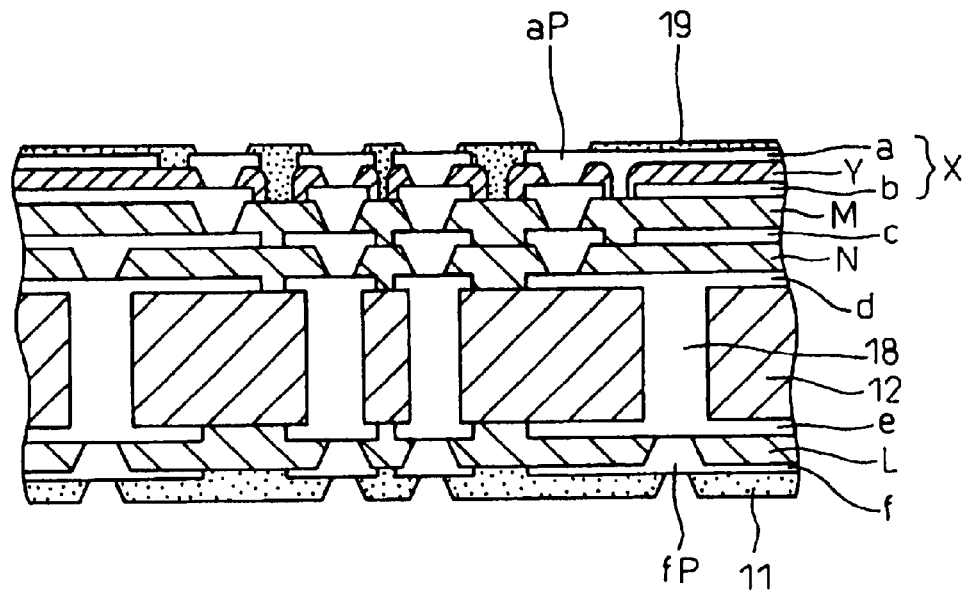
FIG. 11 is a sectional view of step 9 for producing a semiconductor package and semiconductor device according to a first embodiment of the first aspect of the invention.

Step 9. Formation of Solder Resist Layer (FIG. 11)

The top and bottom surfaces are formed with a solder resist layer 19 as a protective layer except at the portions of the outside connection pads aP and fP. The solder resist layer 19 is formed by forming it over the entire surface by printing or thermo compression bonding (vacuum hot pressing etc. also possible), then patterning it to open up the locations of the pads aP and fP.

Next, as shown in FIG. 1, by bonding outside connection terminals (pins) 13 by solder 15 to the bottom surface pads fP, a semiconductor package 10 according to the present invention is completed.

Further, by mounting a semiconductor chip 20 on the top surface, a semiconductor device 30 according to the present invention is completed. This is done by bonding the electrode bumps 22 of the semiconductor chip 20 by solder 17 to the top surface pads aP and bP.

In the example explained above, the interconnect layers were formed by the subtractive method (method of forming layer on entire surface, then removing unnecessary parts by patterning), but it is also possible to form them by the additive method (forming only necessary locations by film formation with masking).

Second Embodiment

Figure 12:
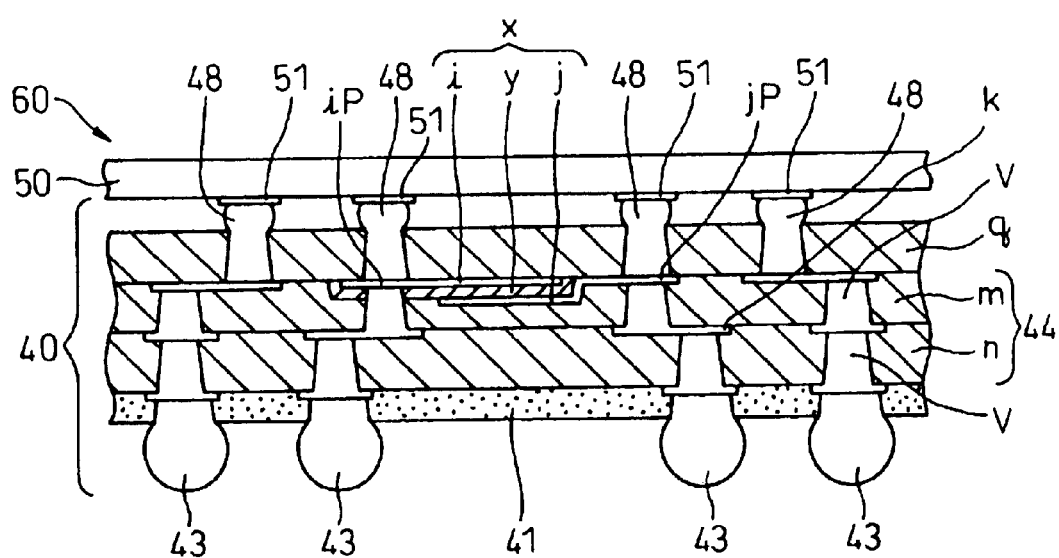
FIG. 12 is a sectional view of a semiconductor device according to the present invention comprised of a semiconductor package according to a second embodiment of a first aspect of the invention in which a semiconductor chip is mounted.

FIG. 12 is a partial sectional view of a semiconductor device 60 according to the present invention comprised of a semiconductor package 40 according to the first aspect of the invention and a semiconductor chip 50 mounted on the same.

The semiconductor package 40 is comprised of a multilayer interconnect structure 44, semiconductor chip connection terminals comprised of solder 48 at the top surface, and outside connection terminals comprised of solder 43 of the bottom surface. The bottom surface is covered by the solder resist 41 except at the positions of the solder 43.

The multilayer interconnect structure 44 is comprised of three interconnect layers "i", "j", and "k" stacked via a dielectric layer "y" or insulating layers "m" and "n". The interconnects "i" to "k" are electrically connected by vias V passing through the insulating layers "m" and "n" at the necessary locations.

The characterizing feature of the first aspect of the invention is that the multilayer interconnect structure 44 is formed with a capacitor structure "x" at its topmost part. The capacitor structure "x" is comprised of a top electrode layer comprised of the interconnect layer "i", a dielectric layer "y", and a bottom electrode layer comprised of the interconnect layer "j". The dielectric layer "y" is comprised of a mixed electrodeposited layer of high dielectric constant inorganic filler and insulating resin. The top electrode layer "i" and the bottom electrode layer "j" are formed at predetermined locations with chip connection pads P in a broad manner and are directly connected to the corresponding electrodes 51 of the semiconductor chip 50 by chip connection terminals comprised of solder 48. That is, the solder 48 is melted to connect to the electrodes 51 of the semiconductor chip 50.

That is, the electrode bumps 52 of the semiconductor chip 50 mounted on the package 40 and the chip connection pads iP and jP of the capacitor "x" formed directly below them are directly connected without going through the outside interconnect routes of the two.

In this way, in the same way as in the first embodiment, the connection distance between the semiconductor chip 50 and capacitor "x" is minimized, so an increase in inductance due to the interconnects between the two can be substantially prevented and the decoupling effect inherent to the capacitor can be sufficiently obtained. Further, the dielectric layer "y" can be formed extremely thin by the mixed electrodeposited layer, so the capacitor as a whole can be formed inside the package 40 as an extremely thin structure, the degree of freedom of design of the interconnect patterns is not lowered, and simultaneously a reduction of the size and weight of the package is not inhibited.

Next, the steps for producing a semiconductor package 40 and semiconductor device 60 according to the first aspect of the invention shown in FIG. 12 will be explained referring to FIGS. 13 to 28. The figures are sectional views of the structure obtained by the processing at the different steps. Note that the steps of production explained below comprise the method of formation of a multilayer interconnect structure on a metal substrate disclosed by the present assignee in Japanese Unexamined Patent Publication (Kokai) No. 2000-323613 plus the step of forming a capacitor structure at the topmost layer of the multilayer interconnect structure according to the present invention.

Figure 13:
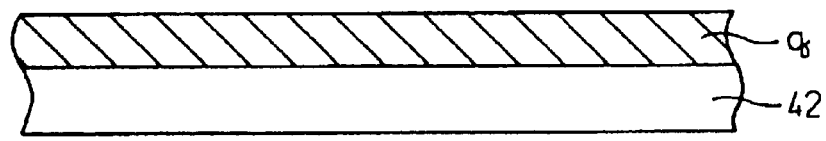
FIG. 13 is a sectional view of step 1 for producing a semiconductor package and semiconductor device according to a second embodiment of the first aspect of the invention.

Step 1. Formation of Insulating Layer on Metal Substrate (FIG. 13)

A metal substrate 42 comprised of copper or aluminum is formed on one surface with an insulating layer "q" by coating an epoxy resin or polyimide resin or laminating a sheet of these resins.

Figure 14:
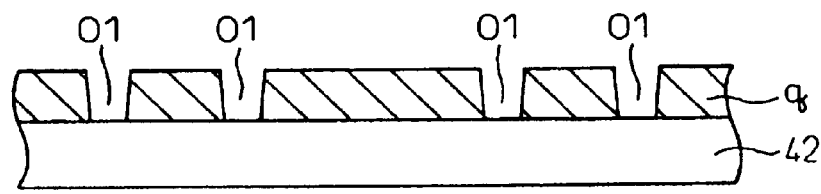
FIG. 14 is a sectional view of step 2 for producing a semiconductor package and semiconductor device according to a second embodiment of the first aspect of the invention.

Step 2. Formation of openings in Insulating Layer (FIG. 14)

The insulating layer "q" is formed with openings O1 by laser processing to expose the above surface of the metal substrate 4 at the bottoms of the openings O1.

Figure 15:
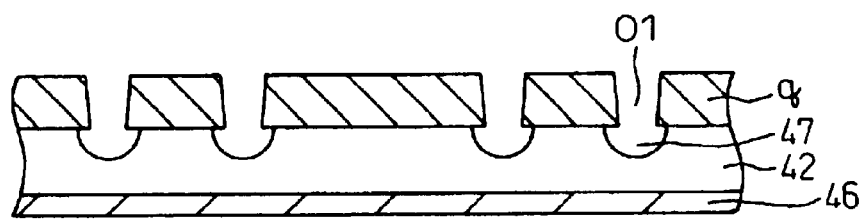
FIG. 15 is a sectional view of step 3 for producing a semiconductor package and semiconductor device according to a second embodiment of the first aspect of the invention.

Step 3. Formation of Depressions in Metal Substrate (FIG. 15)

The other surface of the metal substrate 42 is formed with a resist layer 46, then the exposed parts in the above openings of the metal substrate 42 are etched to form depressions 47 at the surface of the metal substrate 42.

Figure 16:
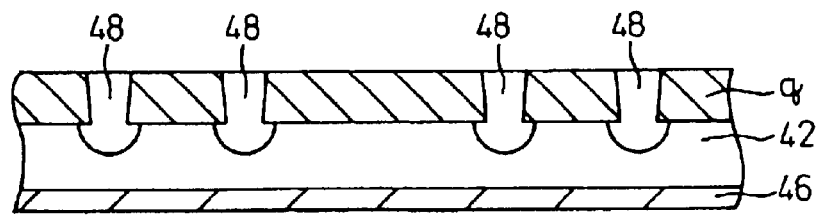
FIG. 16 is a sectional view of step 4 for producing a semiconductor package and semiconductor device according to a second embodiment of the first aspect of the invention.

Step 4. Formation of Solder Layer in Depressions and Openings (FIG. 16)

Electroplating is performed using the metal substrate 42 as a power feed path to form a solder layer 48 continuously filling the depressions 47 and openings O1.

Figure 17:
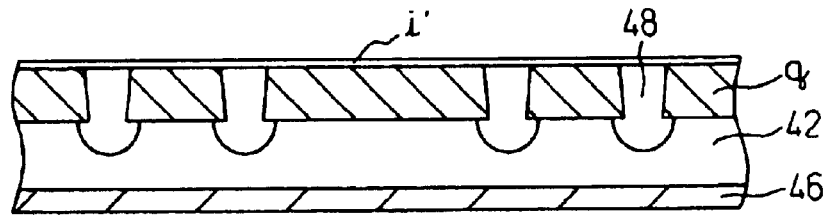
FIG. 17 is a sectional view of step 5 for producing a semiconductor package and semiconductor device according to a second embodiment of the first aspect of the invention.

Step 5. Formation of Metal Layer for Capacitor Electrodes (FIG. 17)

Copper is electrolessly plated and electroplated successively to form a metal layer i' comprised of copper for first electrodes of the capacitor on the entire top surface (on insulating layer "q" and solder layer 48).

Figure 18:
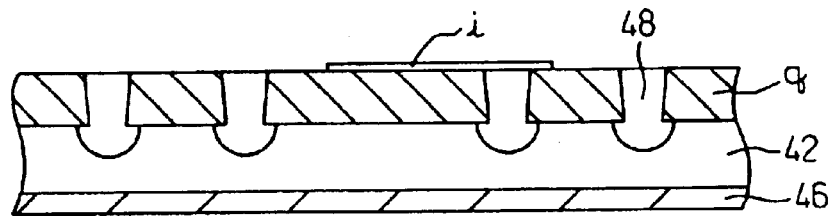
FIG. 18 is a sectional view of step 6 for producing a semiconductor package and semiconductor device according to a second embodiment of the first aspect of the invention.

Step 6. Formation of First Electrodes (FIG. 18)

The metal layer i' is patterned by etching to form the first electrodes (top electrodes) "i" of the capacitor.

Figure 19:
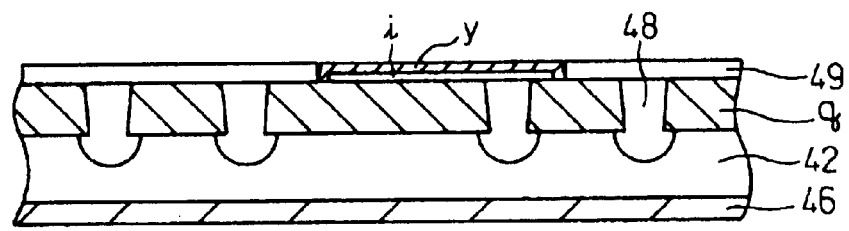
FIG. 19 is a sectional view of step 7 for producing a semiconductor package and semiconductor device according to a second embodiment of the first aspect of the invention.

Step 7. Formation of Dielectric Layer (FIG. 19)

A resist layer 49 is formed covering the insulating layer "q" and solder layer 48. The top electrodes "i" are not covered by the resist layer 49 and are exposed. Next, the surface is washed by alkali or acid and a dielectric layer "y" is formed on the top electrodes "i" by electrodeposition using the resist layer 49 as a mask. This electrodeposition is performed by a method similar to the first embodiment.

Figure 20:
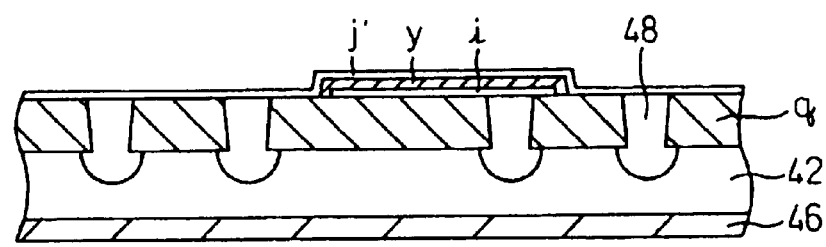
FIG. 20 is a sectional view of step 8 for producing a semiconductor package and semiconductor device according to a second embodiment of the first aspect of the invention.

Step 8. Formation of Metal Layer for Interconnect Layer Including Capacitor Electrodes (FIG. 20)

The resist layer 49 is removed, then copper is electrolessly plated and electroplated successively to form a metal layer j' for an interconnect layer including second electrodes of the capacitor comprised of copper on the entire surface (on insulating layer "q", solder layer 48, and dielectric layer "y").

Figure 21:
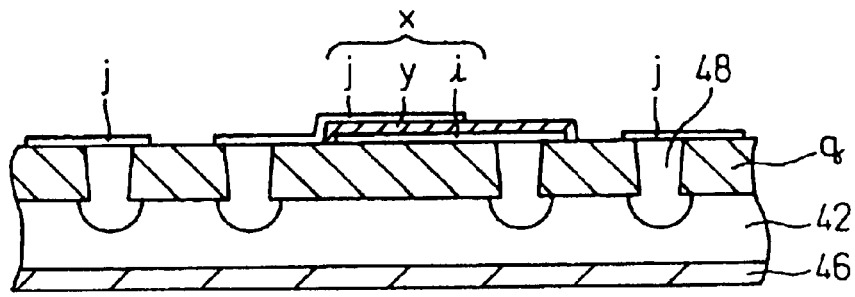
FIG. 21 is a sectional view of step 9 for producing a semiconductor package and semiconductor device according to a second embodiment of the first aspect of the invention.

Step 9. Formation of Second Electrodes and Interconnect Patterns (FIG. 21)

The metal layer j' is patterned by etching to form an interconnect layer "j" including the second electrodes (bottom electrodes) of the capacitor. Due to this, the first electrodes "i" dielectric layer "y", and other electrodes "j" are successively stacked to complete the capacitor "x". In the figure, the top surface of the rightward part of the dielectric layer "y" is not provided with the interconnect layer "j" so as to leave that part of the dielectric layer "y" exposed. This is to form the via passing through the dielectric layer "y" at the rightward part in a later step.

Figure 22:
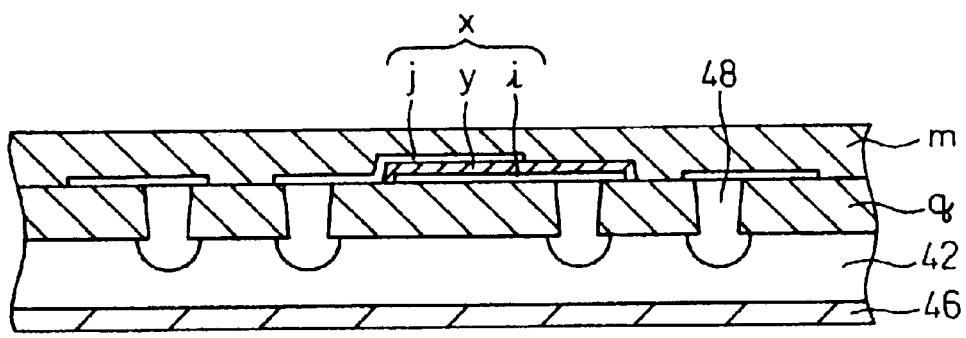
FIG. 22 is a sectional view of step 10 for producing a semiconductor package and semiconductor device according to a second embodiment of the first aspect of the invention.

Step 10. Formation of Insulating Layer (FIG. 22)

The entire top surface (exposed surface of interconnect layer "j" including second electrodes etc.) is formed with an insulating layer "m" by coating an epoxy resin or polyimide resin or by lamination of a sheet of such resins.

Figure 23:
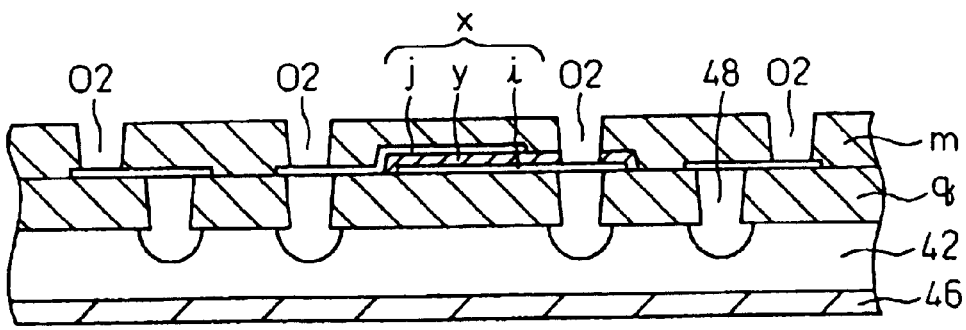
FIG. 23 is a sectional view of step 11 for producing a semiconductor package and semiconductor device according to a second embodiment of the first aspect of the invention.

Step 11. Formation of Openings in Insulating Layer (FIG. 23)

The insulating layer "m" is formed with openings O2 by laser processing to expose the interconnect layer "j" including the second electrodes at the bottom of the openings O2. Note that in the figure, the second opening O2 from the right also passes through the rightward exposed part of the dielectric layer "y" to expose the top surface of the interconnect layer "j" at the bottom.

Figure 24:
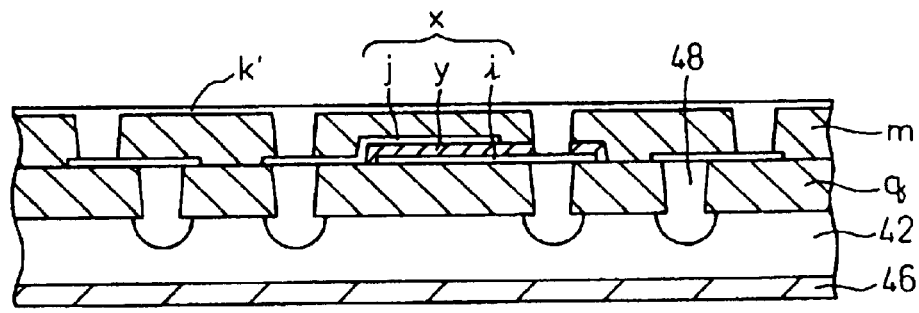
FIG. 24 is a sectional view of step 12 for producing a semiconductor package and semiconductor device according to a second embodiment of the first aspect of the invention.

Step 12. Formation of Metal Layer (FIG. 24)

Copper is electrolessly plated and electroplated successively to form a metal layer k' covering the insulating layer "m" and filling the openings O2.

Figure 25:
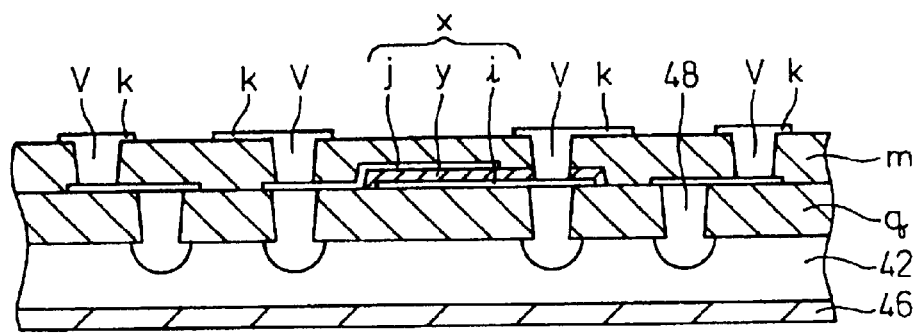
FIG. 25 is a sectional view of step 13 for producing a semiconductor package and semiconductor device according to a second embodiment of the first aspect of the invention.

Step 13. Formation of Vias and Interconnect Layer (FIG. 25)

The metal layer k' is patterned by etching to form the vias V and interconnect layer "k".

Figure 26:
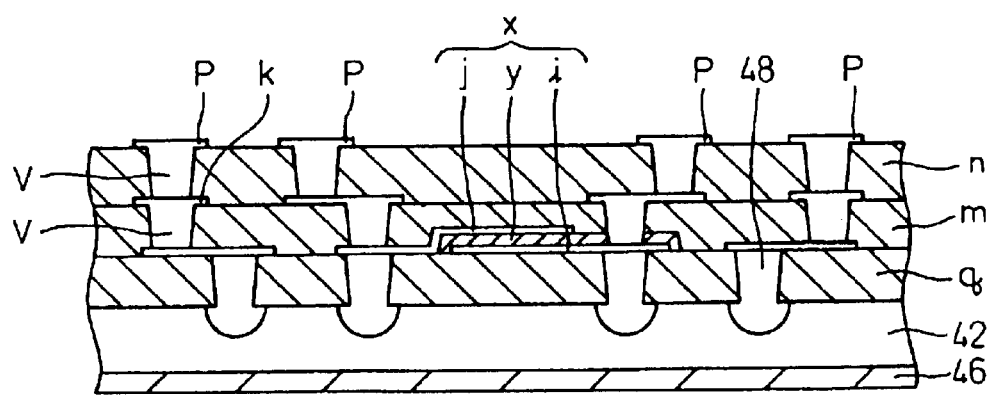
FIG. 26 is a sectional view of step 14 for producing a semiconductor package and semiconductor device according to a second embodiment of the first aspect of the invention.

Step 14. Further Formation of Insulating Layer and Interconnect Layer (FIG. 26)

By repeating the above step 10 to step 13 a required number of times, a desired multilayer interconnect structure is obtained. In the illustrated embodiment, these steps are repeated only once to form an insulating layer "n" and pads P for outside connection terminals on the top.

Figure 27:
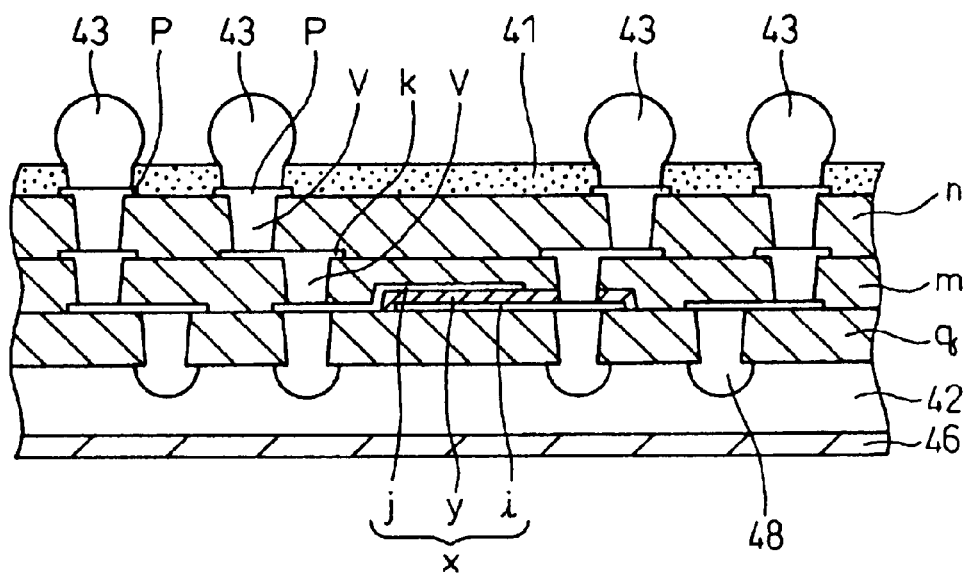
FIG. 27 is a sectional view of step 15 for producing a semiconductor package and semiconductor device according to a second embodiment of the first aspect of the invention.

Step 15. Formation of Outside Connection Terminals (FIG. 27)

The entire top surface other than the pads P is covered by a solder resist layer 41, then solder balls 43 are joined on the pads P as outside connection terminals.

Figure 28:
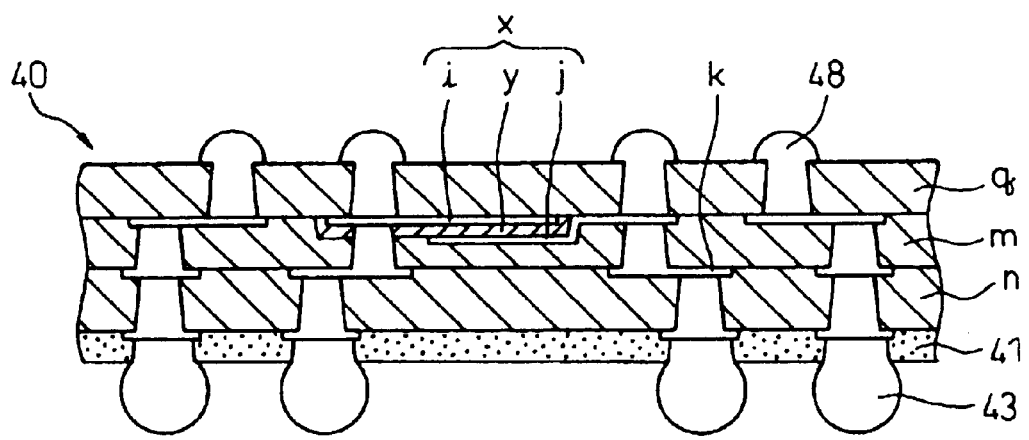
FIG. 28 is a sectional view of step 16 for producing a semiconductor package and semiconductor device according to a second embodiment of the first aspect of the invention.

Step 16. Removal of Metal Substrate (FIG. 28)

This figure is shown in a state upside down from the figures of the preceding steps. At this step, the resist layer 46 is removed, then the metal substrate 42 is removed by etching. This etching is performed using an etchant which etches the metal substrate 42 (copper or aluminum), but does not etch the solder 48. Due to this, the solder 48 filled in the depressions 47 (FIG. 15) of the metal substrate 42 is exposed at the surface of the insulating layer "q" and forms the semiconductor chip connection bumps. With this, the semiconductor package 40 of the first aspect of the invention is completed.

Step 17. Mounting of Semiconductor Chip (FIG. 12)

The electrodes 51 of the semiconductor chip 50 are positioned at predetermined solder bumps 48. The solder bumps 48 are made to melt and solidify to bond the electrodes 51 and bumps 48 of the semiconductor chip. Due to this, the semiconductor device 60 of the present invention comprised of the semiconductor package 40 of the first aspect of the invention and a semiconductor chip 50 mounted in it is completed.

The semiconductor package and semiconductor device according to the first aspect of the invention explained in the first embodiment and second embodiment above represent the best modes of the present invention in the point that the connection distance between the semiconductor chip and capacitor can be minimized.

However, the invention is not limited to such best modes. The effect of improving the proximity of the semiconductor chip and capacitor compared with the conventional structure can be sufficiently obtained even by the second aspect of the invention described below.

Third Embodiment

Figure 29:
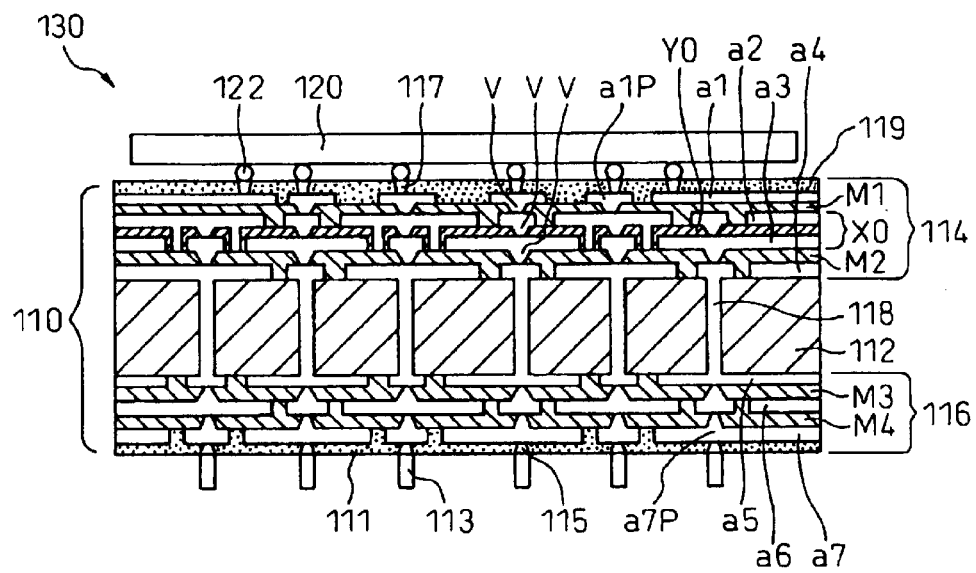
FIG. 29 is a sectional view of a semiconductor device according to the present invention comprised of a semiconductor package according to a first embodiment of the second aspect of the invention in which a semiconductor chip is mounted.

FIG. 29 is a partial sectional view of a semiconductor device 130 according to the present invention comprised of a semiconductor package 110 according to the second aspect of the invention and a semiconductor chip 120 mounted on it.

The semiconductor package 110 according to the second aspect of the invention is comprised of an insulating substrate 112 on the top and bottom surfaces of which multilayer interconnect structures 114 and 116 are provided. Through holes 118 are provided passing through the insulating substrate 112 to electrically connect the bottommost layer a4 of the top surface multilayer interconnect structure 114 and the topmost layer a5 of the bottom surface multilayer interconnect structure 116.

The aim of the structure is to prevent the occurrence of warping of the substrate in the process of production by constantly keeping the number of layers stacked on the two surfaces of the insulating substrate constant by successively building up the multilayer interconnect structures on the two surfaces of the substrate simultaneously and in parallel.

The bottom surface multilayer interconnect structure 16 is a structure comprised of three interconnect layers a5, a6, and a7 stacked via insulating layers M3 and M4. Predetermined locations of the bottommost interconnect layer a7 are formed with outside connection pads a7P. Outside connection terminals (pins) 113 are joined to these by solder 115. The illustrated six pins 113 include for example a ground terminal (GR) at the left end, four signal terminals (S) at the center, and a power terminal (P) at the right end. The bottom surface of the bottom surface multilayer interconnect structure 116 is covered by a solder resist 111 except at the positions of the solder 115.

The top surface multilayer interconnect structure 114 is comprised of four interconnect layers a1, a2, a3, and a4 stacked via insulating layers M1 and M2 or a dielectric layer Y0. The interconnect layers a1 to a4 are electrically connected by vias V passing through the dielectric layer Y0 or insulating layers M1 and M2 at the necessary locations.

The characterizing feature of the second aspect of the invention is that the top surface multilayer interconnect structure 114 includes a capacitor structure X0. The capacitor structure X0 is comprised of the top electrode layer comprised of the interconnect layer a2, the dielectric layer Y0, and the bottom electrode layer comprised of the interconnect layer a3. The dielectric layer Y0 is comprised of a mixed electrodeposited layer of high dielectric constant inorganic filler and insulating resin. Predetermined locations of the top electrode layer a2 and bottom electrode layer a3 are connected at separate predetermined locations formed at the topmost interconnect layer a1 through the vias V. Predetermined locations are formed as the chip connection pads a1P and are connected to the electrode bumps 122 of the semiconductor chip 120 by solder 177. That is, the solder 117 is provided by coating solder paste by screen printing or mounting solder balls. The solder 117 is made to melt to connect the electrode bumps 122 of the semiconductor chip 120. The electrode bumps 122 are directly formed by solder on the electrodes of the capacitor chip 120 and are substantially integral with the electrodes.

In this way, the semiconductor package of the second aspect of the invention and the semiconductor device of the present invention using this are provided with chip connection pads a1P for connection with the top electrodes (interconnect layer a2) and bottom electrodes (interconnect layer a3) of the capacitor structure X0 and the electrode bumps 122 of the semiconductor chip 120 in a region of the top surface multilayer interconnect structure 114 superposed with the capacitor structure X0 in a plan view. Due to this, compared with the structure using a conventional chip capacitor or other capacitor, it is possible to greatly shorten the connection distance between the semiconductor chip and capacitor.

That is, in the past, the chip capacitor or other capacitor had been arranged at another region from the semiconductor chip of the top surface of the top surface multilayer interconnect structure. When arranging a chip capacitor or other capacitor on the top surface side the same as the semiconductor chip, the connection distance becomes on the order of several mm corresponding to the planar dimensions of the chip, while when arranging the capacitor at the bottom surface side opposite to the semiconductor chip, the connection distance becomes about 0.2 mm to 0.8 mm (200 $\mu$m to 800 $\mu$m) corresponding to the thickness of the insulating layer.

As opposed to this, with the structure of the second aspect of the invention, a capacitor structure is provided inside the multilayer interconnect structure at the top surface side the same as the semiconductor chip. Further, connection pads with the semiconductor chip are provided inside the region superposed with the capacitor structure in a plan view, therefore the connection distance does not exceed the thickness of the top surface multilayer interconnect structure even at the maximum. The thickness of the top surface multilayer interconnect structure includes the 20 $\mu$m or so of the insulating layer and the 15 $\mu$m or so of the interconnect layer. The thickness of the top surface multilayer interconnect structure 114 becomes the total of the insulating layers (M1+M2=40 $\mu$m), the interconnect layers including the electrode layers (a1+a2+a3+a4=60 $\mu$m), and the dielectric layer Y0 (10 $\mu$m) or 110 $\mu$m.

Looking at the connection distance between the semiconductor chip 120 and the capacitor structure X0 in a little more detail, the connection distance from the bottom electrode a3 of the capacitor structure X0 (electrode farther from the semiconductor chip 120) to the interconnect layer a1 to be connected to the electrode 122 of the semiconductor chip 120 corresponds to the total of the thicknesses of the dielectric layer Y0 (10 $\mu$m), the top electrode a2 (15 $\mu$m), the insulating layer M1 (20 $\mu$m), and the interconnect layer a1 (15 $\mu$m), that is, 60 $\mu$m.

As opposed to this, if mounting a chip capacitor at for example the bottom surface side as in the past, the thickness of the insulating substrate (200 to 800 $\mu$m) has further added to it the total thickness of the top and bottom multilayer interconnect structures 114 and 116 (in a structure equivalent to FIG. 29, about 200 $\mu$m even at the minimum), so the connection distance between the semiconductor chip and capacitor becomes about 400 $\mu$m to 1000 $\mu$m (1 $\mu$m).

In this way, according to the second aspect of the invention, while not shortening to the maximum as in the first aspect of the invention, it is possible to greatly shorten the connection distance between the semiconductor chip and capacitor compared with the conventional structure. Further, in the same way as in the first aspect of the invention, it is possible to secure a degree of freedom of design of the interconnect patterns. In this way, even with the semiconductor package and semiconductor device according to the second aspect of the invention, a practical, sufficient advantageous effect is obtained.

Further, according to the second aspect of the invention, the capacitor structure does not have to be limited to one layer. Even if stacking a plurality of layers, an effect of shortening the connection distance from the conventional structure is obtained.

Figure 30:
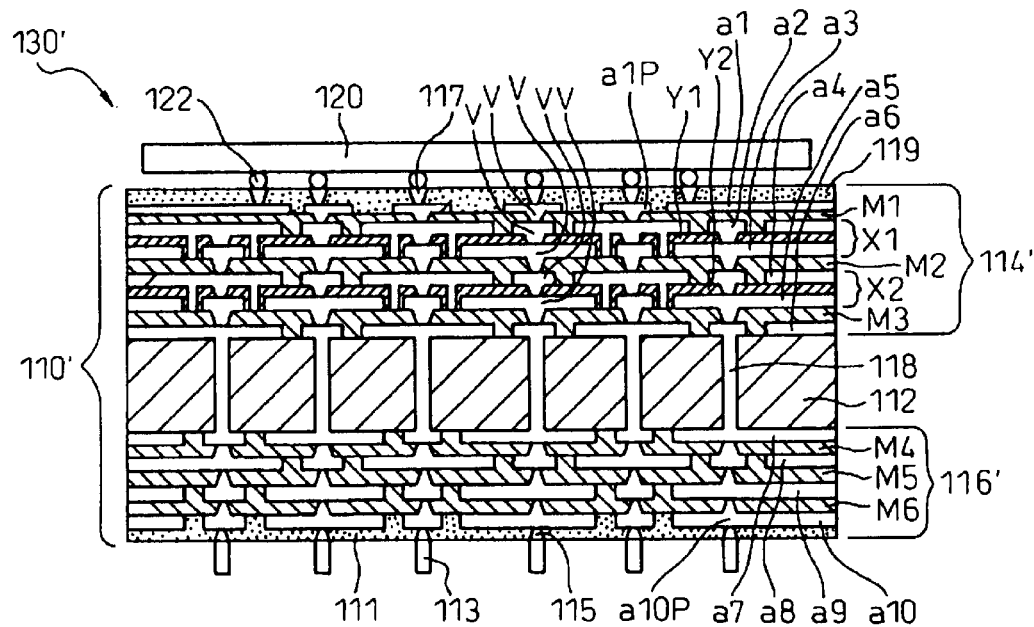
FIG. 30 is a sectional view of a semiconductor device according to the present invention comprised of a semiconductor package according to another embodiment of the second aspect of the invention in which a semiconductor chip is mounted.

FIG. 30 is a partial sectional view of a semiconductor device 130' comprised of a semiconductor package 110' of the second aspect of the invention provided with two layers of capacitor structures stacked together and a semiconductor chip 120 mounted on it. That is, this structure has two capacitor structures X1 and X2 stacked inside the top surface multilayer interconnect structure 114'. The top surface multilayer interconnect structure 114' has six interconnect layers a1 to a6 stacked via insulating layers M1, M2, and M3 or dielectric layers Y1 and Y2. The capacitor structure X1 is comprised of top electrodes comprised of an interconnect layer a2, a dielectric layer Y1, and bottom electrodes comprised of an interconnect layer a3. The capacitor structure X2 is comprised of top electrodes comprised of an interconnect layer a4, a dielectric layer Y2, and bottom electrodes comprised of an interconnect layer a5.

The bottom surface multilayer interconnect structure 116' is a structure comprised of four interconnect layers a7 to a10 stacked via insulating layers M4 to M6. Predetermined locations of the bottommost interconnect layer a10P are formed as outside connection pads a10P.

For the rest of the configuration, portions assigned the same reference numerals as in FIG. 29 are as explained in that figure.

As shown in FIG. 30, even when providing two layers of capacitor structures, the connection distance from the semiconductor chip 120 to the bottom electrode a5 of the capacitor structure X2 of the farther bottom surface corresponds to the connection distance 60 μm in the case of the capacitor structure 1 layer type of FIG. 29 plus the total thickness 60 μm of the bottom electrodes a3 (15 μm) of the top surface capacitor structure X1, the insulating layer M2 (20 μm) separating the top and bottom capacitor structures X1 and X2, the top electrodes a4 (15 μm) of the bottom surface capacitor structure X2, and the dielectric layer Y2 (10 μm), that is, 120 μm.

As opposed to this, in the conventional structure, when stacking a number of multilayer interconnects corresponding to the structure of FIG. 30, the distance corresponds to the above-mentioned 400 μm to 1000 μm (1 mm) plus the total thickness of about 100 μm of the interconnect layer 2 (15 μm×2=30 μm) of the top interconnect structure, two layers worth of the insulating layer (20 μm×2=40 μm), one layers worth of the interconnect layer (15 μm) of the bottom layer interconnect structure, and one layer's worth of the insulating layer (20 μm) or 500 μm to 1100 μm (1.1 mm).

Therefore, even when providing two layers capacitor structures as shown in FIG. 30, according to the second aspect of the invention, it is possible to greatly shorten the connection distance compared with the conventional structure. Of course, the degree of freedom of design of the interconnect patterns can be similarly secured.

Next, the steps for producing a semiconductor package 110 and semiconductor device 130 according to a first embodiment of the second aspect of the invention will be explained referring to FIGS. 31 to 38. The figures are sectional views of the structure obtained by the processing at the different steps. Note that the portions where the bottom two digits of the reference numerals in FIGS. 31 to 38 correspond to the reference numerals in FIGS. 3 to 11 used for explanation of the steps in the first embodiment may be formed by materials and methods of formation similar to the corresponding portions of FIGS. 3 to 11.

Figure 31:
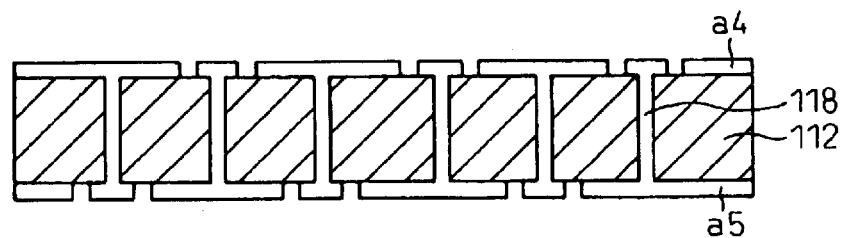
FIG. 31 is a sectional view of step 1 for producing a semiconductor package and semiconductor device according to a first embodiment of the second aspect of the invention.

Step 1. Preparations of Substrate, Formation of Through Holes, and Formation of Interconnect Patterns (FIG. 31)

By performing processing similar to steps 1 to 2 (FIGS. 3 to 4) of the first embodiment, the top and bottom surfaces of an insulating core 112 are provided with interconnects a4 and a5. The top and bottom interconnect layers a4/a5 are electrically connected by through holes 118 filled with conductors.

Figure 32:
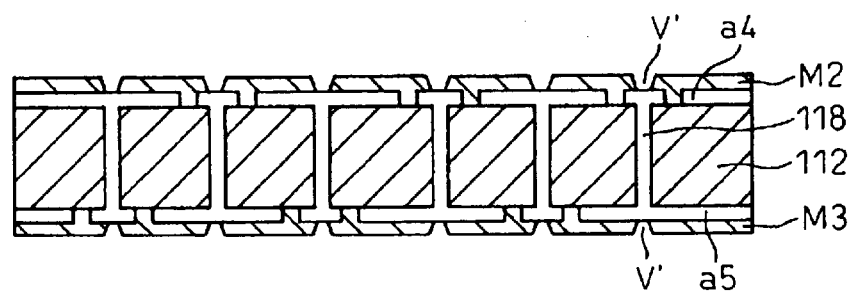
FIG. 32 is a sectional view of step 2 for producing a semiconductor package and semiconductor device according to a first embodiment of the second aspect of the invention.

Step 2. Formation of Insulating Layer (FIG. 32)

By performing processing similar to step 3 (FIG. 5) of the first embodiment, insulating layers M2 and M3 for insulating between the interconnect layers are formed on the top and bottom surface interconnect layers a4 and a5, the via holes V' are formed in the insulating layers M2 and M3 for electrically connecting between interconnect layers.

Figure 33:
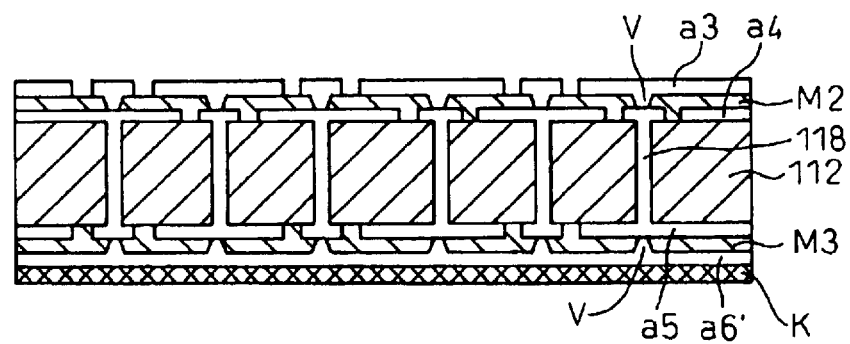
FIG. 33 is a sectional view of step 3 for producing a semiconductor package and semiconductor device according to a first embodiment of the second aspect of the invention.

Step 3. Formation of Bottom Electrodes and Filling of Via Holes (FIG. 33)

By performing processing similar to steps 4 to 5 (FIGS. 6 to 7) of the first embodiment, the top and bottom surface insulating layers M2 and M3 are formed with conductor layers, and the via holes V' are filled by the conductor to form vias V. Next, the top surface conductor layer is etched to form bottom electrodes a3 of a capacitor structure X2 (FIG. 29). After etching, the bottom surface conductor layer a6' is covered by a mask K and not etched. It is used as a power feed layer when forming a dielectric layer in a later step.

Figure 34:
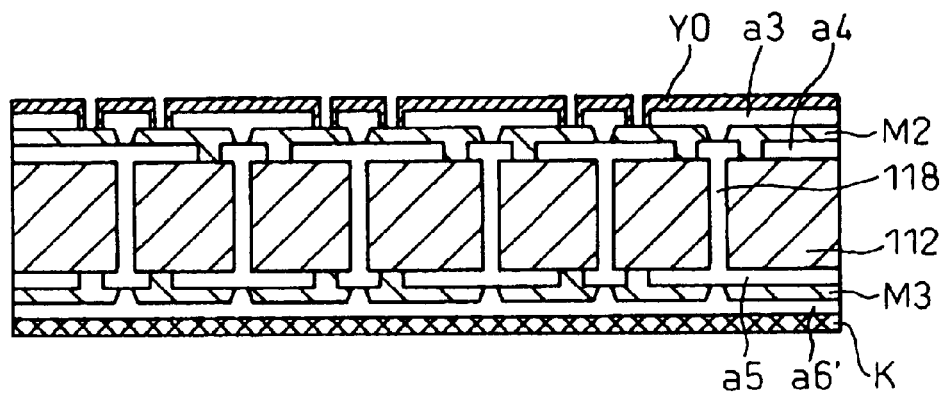
FIG. 34 is a sectional view of step 4 for producing a semiconductor package and semiconductor device according to a first embodiment of the second aspect of the invention.

Step 4. Formation of Dielectric Layer (FIG. 34)

The bottom surface dielectric layer a6' is used as a power feed layer for performing electrodeposition in the same way as the first embodiment to form a dielectric layer Y0 on the bottom electrodes a3.

Figure 35:
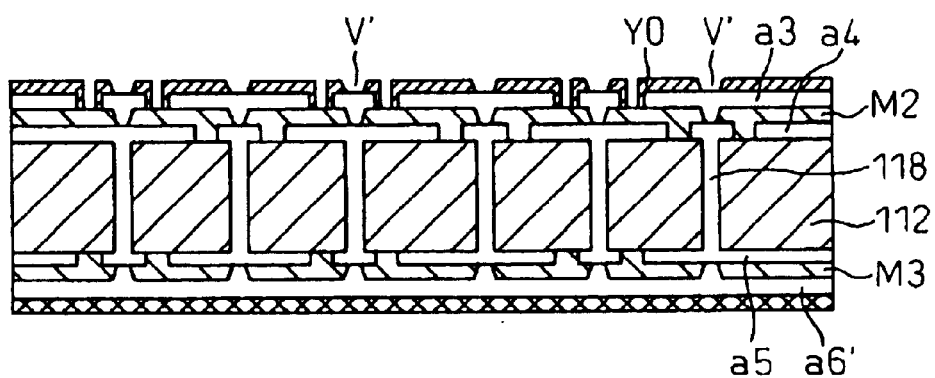
FIG. 35 is a sectional view of step 5 for producing a semiconductor package and semiconductor device according to a first embodiment of the second aspect of the invention.

Step 5. Formation of Via Holes of Dielectric Layer (FIG. 35)

Laser processing is used to form via holes V' in the dielectric layer Y0.

Figure 36:
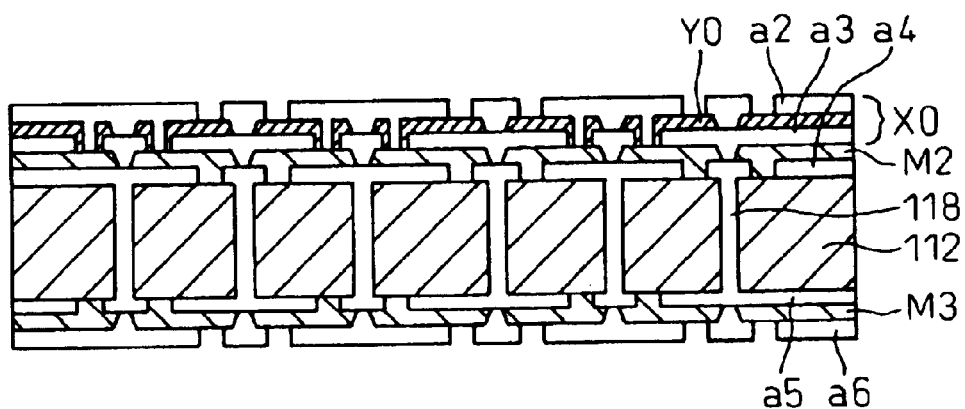
FIG. 36 is a sectional view of step 6 for producing a semiconductor package and semiconductor device according to a first embodiment of the second aspect of the invention.
Figure 37:
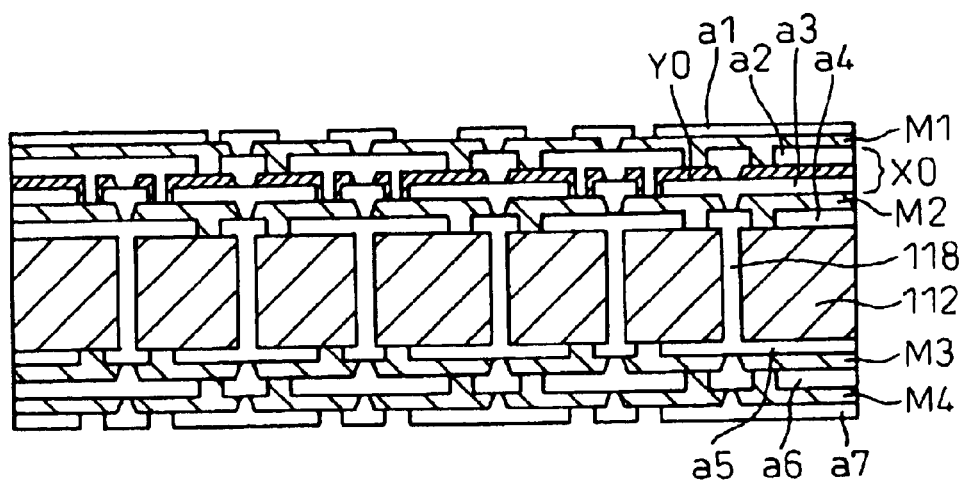
FIG. 37 is a sectional view of step 7 for producing a semiconductor package and semiconductor device according to a first embodiment of the second aspect of the invention.

Step 6. Formation of Top Electrodes (FIG. 36)

By performing similar processing as at step 8 (FIG. 10) of the first embodiment with the mask K provided as is, the via holes V' are filled to form vias V and a conductor layer is formed on the dielectric layer Y0, then the mask K is removed and the conductor layer and bottom surface conductor layer a6' are simultaneously etched to form the top electrodes a2 and bottom interconnect layer a6. Due to this, a capacitor structure X0 comprised of the top electrodes a2, dielectric layer Y0, and bottom electrodes a3 is completed as part of the top surface multilayer interconnect structure.

Step 7. Formation of Insulating Layer/Interconnect Layer

By repeating steps 2 and 3 one more time, one set of insulating layer M1 and interconnect layer a1 and one set of insulating layer M4 and interconnect layer a7 are stacked (built up) on the top and bottom surfaces. Here, the case is shown of adding another interconnect layer at the top and bottom surfaces. It is sufficient to repeat steps 2 and 3 for exactly the number of times corresponding to the number of interconnect layers required.

Figure 38:
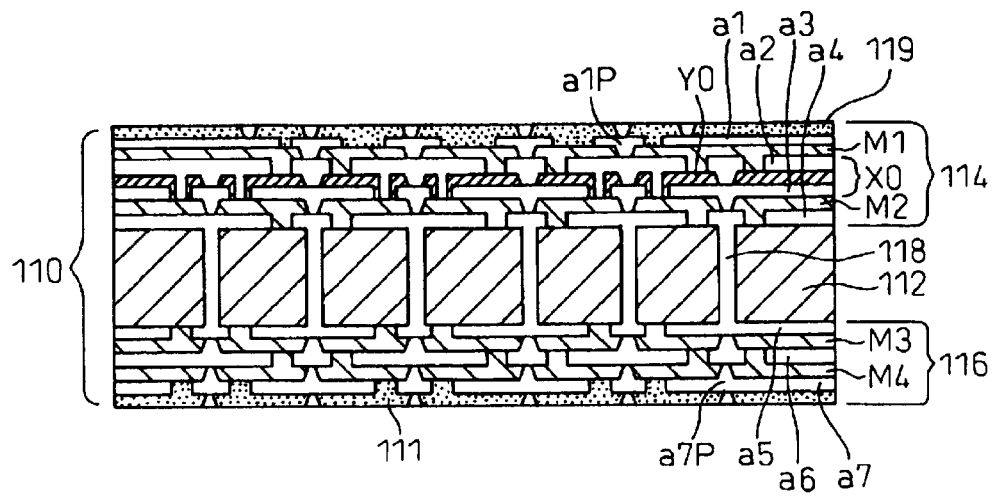
FIG. 38 is a sectional view of step 8 for producing a semiconductor package and semiconductor device according to a first embodiment of the second aspect of the invention.
Figure 39:
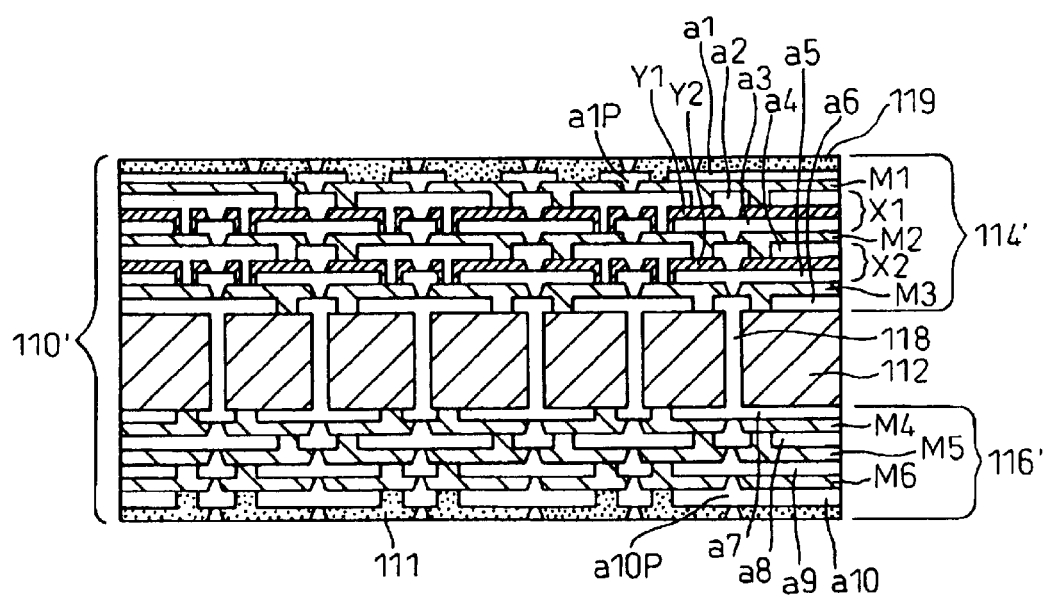
FIG. 39 is a sectional view of the step at the stage corresponding to FIG. 38 showing a step of production of the first embodiment for producing a semiconductor package according to another embodiment of the second aspect of the invention and a semiconductor device.

Step 8. Formation of Solder Resist Layer (FIG. 38)

By performing similar processing as step 9 (FIG. 11) of the first embodiment, solder resist layers 119 and 111 are formed as protective layers except at the parts of the chip connection pads a1P and outside connection terminal pads a7P. The pad parts a1P and a7P are successively plated by nickel (Ni) and gold (Au). Due to this, the top surface multilayer interconnect structure 114 and bottom surface multilayer interconnect structure 116 are substantially simultaneously completed.

Step 9. Completion of Semiconductor Package and Semiconductor Device (FIG. 29)

Next, as shown in FIG. 29, the pins 113 and other outside connection terminals are bonded by solder 115 to the bottom surface outside connection terminal pads a7P to complete the semiconductor package 110. Further, the electrode terminals 122 of the semiconductor chip 120 are bonded to the top surface chip connection pads a1P by solder 117 to mount the semiconductor chip 120 and thereby complete the semiconductor device 130.

Above, according to the second aspect of the invention, the process of production of a semiconductor package 110 and semiconductor device 130 (FIG. 29) provided with just one capacitor structure at the top surface multilayer interconnect structure was explained.

As shown in FIG. 30, the structures of a semiconductor package 110' and semiconductor device 130' according to the second aspect of the invention of a structure stacking two capacitor structures are basically the same as above, but by performing steps 4 to 7 (FIG. 34 to FIG. 37) two times, a capacitor structure X2 (bottom electrodes a5, dielectric layer Y2, and top electrodes a4), a capacitor structure X1 (bottom electrodes a3, dielectric layer Y1, and top electrodes a2), and insulating layer M2 between the two are formed. Due to this, an internal top surface multilayer interconnect structure 114' including two stacked capacitor structures X1 and X2 is formed. Further, one interconnect layer is also added at the bottom surface corresponding to an interconnect layer of one layer's worth of the top surface capacitor structure. The rest of the steps may be performed in the same way as the steps for producing the structure of FIG. 29.

Note that FIG. 30 showed an example of two layers of capacitor structures, but by further repeating steps 4 to 7 (FIGS. 34 to 37), it is possible to provide three or more layers of capacitor structures. At this time, it is preferable to increase the number of interconnect layers of the bottom multilayer interconnect structure corresponding to the number of increased layers of the capacitor structures. That is, by successively building up multilayer interconnect structures at the two surfaces of the insulating substrate simultaneously and in parallel, the numbers of layers stacked at the two surfaces of the substrate are constantly balanced and occurrence of warping of the substrate in the process of production is prevented.

Summarizing the effects of the invention, there is provided a semiconductor package securing a degree of freedom of design of interconnect patterns, greatly increasing the degree of proximity of the capacitor and semiconductor chip, and enabling a reduction of the size and weight of the package, a method of production of the same, and a semiconductor device using such a semiconductor package.

While the invention has been described with reference to specific embodiments chosen for purpose of illustration, it should be apparent that numerous modifications could be made thereto by those skilled in the art without departing from the basic concept and scope of the invention.

What is claimed is:

1. A semiconductor package, provided with a multilayer interconnect structure, for mounting a semiconductor chip on its top surface, wherein:

a topmost stacked structure of the multilayer interconnect structure includes a capacitor structure, said capacitor structure having a dielectric layer comprised of a mixed electrodeposited layer of a high dielectric constant inorganic filler and an insulating resin and including chip connection pads for directly connecting top electrodes and bottom electrodes with electrodes of said semiconductor chip, wherein the dielectric layer is selectively provided only on an electrode of the capacitor structure and wherein the inorganic filler is a powder of ceramic having a perovskite structure.

2. A semiconductor package as set forth in claim 1, wherein said insulating resin is a polyimide resin.

3. A semiconductor device comprised of a semiconductor package as set forth in claim 1 and a semiconductor chip directly connected at its electrodes to the chip connection pads.

4. A semiconductor package, comprised of an insulating substrate on top and bottom surfaces of which multilayer interconnect structures are provided, for mounting a semiconductor chip on the top surface of a top surface multilayer interconnect structure, wherein:

the top surface multilayer structure includes a capacitor structure, said capacitor structure having a dielectric layer comprised of a mixed electrodeposited layer of a high dielectric constant inorganic filler and an insulating resin, and a topmost layer of said top surface multilayer interconnect structure includes chip connection pads for connecting top electrodes and bottom electrodes with electrodes of said semiconductor chip inside a region superposed with said capacitor structure in a plan view, wherein the dielectric layer is selectively provided only on an electrode of the capacitor structure and wherein the inorganic filler is a powder of ceramic having a perovskite structure.

5. A semiconductor package as set forth in claim 2, wherein said top surface multilayer interconnect structure includes a plurality of stacked capacitor structures.

6. A semiconductor package as set forth in claim 5, wherein said insulating resin is a polyimide resin.

7. A semiconductor device comprised of a semiconductor package as set forth in claim 5 and a semiconductor chip directly connected at its electrodes to the chip connection pads.

8. A semiconductor package as set forth in claim 4, wherein said inorganic filler is a powder of ceramic having a perovskite structure.

9. A semiconductor package as set forth in claim 4, wherein said insulating resin is a polyimide resin.

10. A semiconductor device comprised of a semiconductor package as set forth in claim 4 and a semiconductor chip directly connected at its electrodes to the chip connection pads.

* * * * *

UNITED STATES PATENT AND TRADEMARK OFFICE
CERTIFICATE OF CORRECTION

| | | |
|---|---|---|
| PATENT NO. | : 6,921,977 B2 | Page 1 of 1 |
| APPLICATION NO. | : 10/647386 | |
| DATED | : July 26, 2005 | |
| INVENTOR(S) | : Noriyoshi Shimizu et al. | |

It is certified that error appears in the above-identified patent and that said Letters Patent is hereby corrected as shown below:

Column 2, line 53, after "with" delete "the".

Column 7, line 13, change "minimized," to --minimized.--

Column 10, line 64, change "openings" to --Openings--

Column 14, line 30, change "(1μm)." to --(1mm).--

Column 15, line 26, after "two layers" insert --of--.

Column 15, line 43, change "Preparations" to --Preparation--.

Column 15, line 55, after "4a and 5a" change "the" to --then--.

Column 18, line 24, change "claim 2" to --claim 4--.

Signed and Sealed this

Twenty-fifth Day of March, 2008

JON W. DUDAS
*Director of the United States Patent and Trademark Office*